United States Patent
Schmidt et al.

(10) Patent No.: US 6,717,530 B1
(45) Date of Patent: Apr. 6, 2004

(54) MULTIPLE TEMPERATURE THRESHOLD SENSING HAVING A SINGLE SENSE ELEMENT

(75) Inventors: Thomas A. Schmidt, Dallas, TX (US); Andrew Marshall, Dallas, TX (US); Jingwei Xu, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 712 days.

(21) Appl. No.: 09/638,839

(22) Filed: Aug. 14, 2000

(51) Int. Cl.⁷ .............................................. G08B 29/26
(52) U.S. Cl. .................. 340/870.17; 340/870.16; 702/130; 702/132
(58) Field of Search .............. 340/870.17, 870.16; 327/12, 513, 3, 7, 115, 101; 702/132, 130, 131; 324/760

(56) References Cited

U.S. PATENT DOCUMENTS

| | | |
|---|---|---|
| 5,422,832 A | 6/1995 | Moyal |
| 5,563,760 A | 10/1996 | Lowis et al. |
| 5,838,578 A | 11/1998 | Pippin |

*Primary Examiner*—Michael Horabik
*Assistant Examiner*—Hung Dang
(74) *Attorney, Agent, or Firm*—April M. Mosby; Wade James Brady, III; Frederick J. Telecky, Jr.

(57) ABSTRACT

A temperature sensing system (30) that providing at least one detect signal related to temperature in an integrated circuit is presented. This system uses one thermal sensing circuit (40) to detect two or more temperature thresholds ($t_2$, $t_3$) and differentiates the temperature thresholds using time multiplexed logic control. The system (80) capable of detecting more than two temperatures includes the thermal sensing circuit (90) and a decode circuit (92) with at least one detect latch (100). Optionally, the system may include a hysteresis circuit (60). The thermal sensing circuit (40), connected to the integrated circuit, generates a detect signal ($D_4$) in response to the a temperature selection signal ($T_1$). This flexible on-board temperature monitoring solution reduces the cost of thermal feedback sensing by reducing die area and improves the correlation of detected temperatures. In addition, this solution reduces the possibility of mismatch and tracking errors between two or more sense elements.

11 Claims, 5 Drawing Sheets

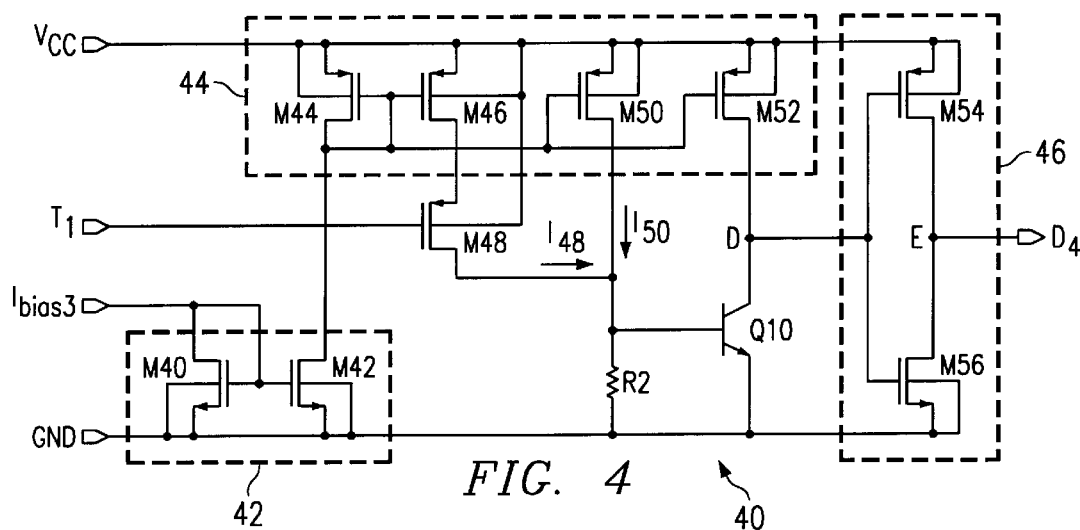
FIG. 4
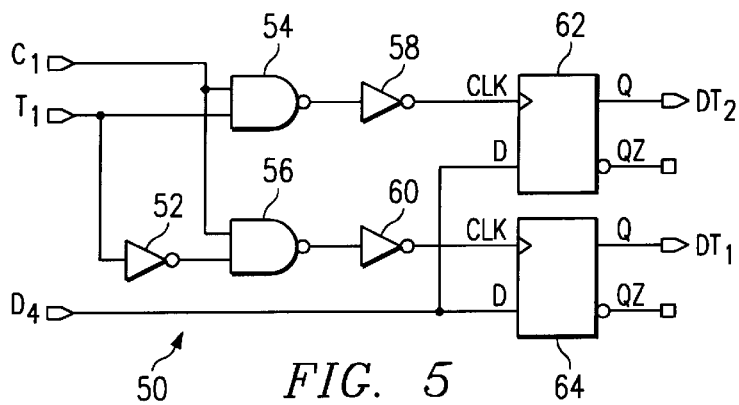
FIG. 5
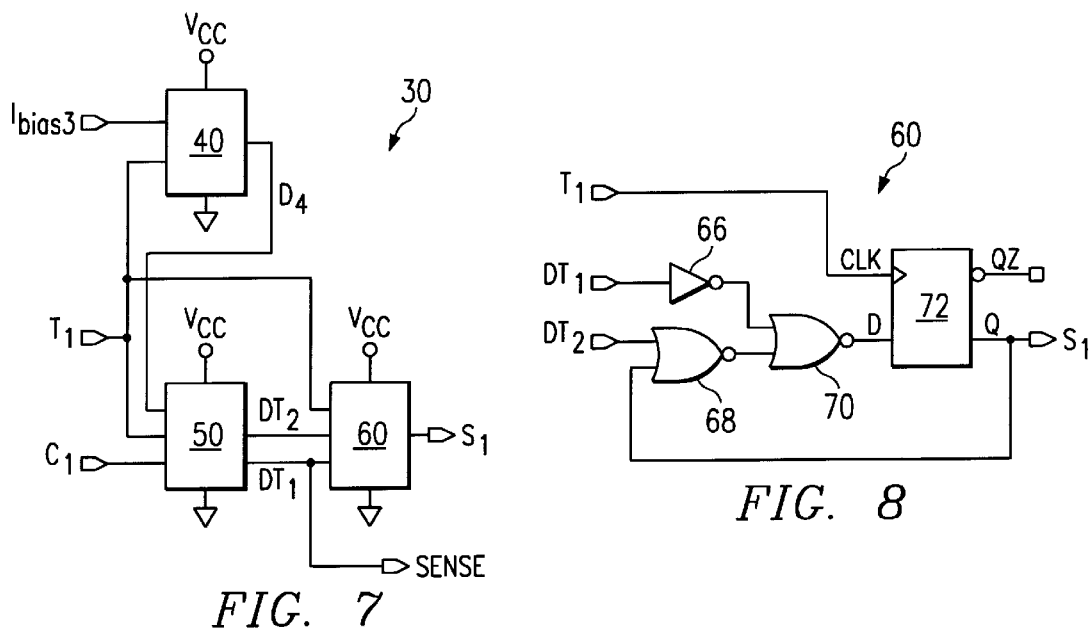
FIG. 7
FIG. 8

MULTIPLE TEMPERATURE THRESHOLD SENSING HAVING A SINGLE SENSE ELEMENT

FIELD OF THE INVENTION

This invention relates generally to the field of temperature threshold sensing; and, in particular, to a multiple temperature threshold sensing circuit having a single sense element.

BACKGROUND OF THE INVENTION

Over the past two decades, the semiconductor industry has greatly advanced from incorporating a few transistors on one integrated circuit chip to incorporating millions of transistors. The integrated circuit is at the heart of most electronic equipment today, e.g. navigational systems, computers, pocket calculators, industrial monitoring and control systems, digital watches, digital sound systems, word processors, communications networks, and innumerable others. The vast number of transistors on a small area of semiconductor material has its advantages in speed, reliability, and negligible weight, but has its disadvantages in power consumption. More specifically, due to the increase in power consumed by each transistor, there exists a cumulative effect of temperature rise.

Conventional systems use two forms of cooling systems: passive and active. These cooling systems are mounted a circuit board that includes the integrated circuit package. Passive cooling involves the use of a heat sink. This form of cooling however has limited capacity to dissipate heat and increases the weight of the complete circuit board module. Active cooling involves the use of a device such as a fan which pulls air over the package to cool the die. Fans are not efficient because they require more space and power. In addition, fans are not desirable because they generate noise.

In addition to the use of cooling systems, thermal sensing systems are used to monitor the temperature of the integrated circuit. More specifically, they monitor portions of the integrated circuit having specific functions within an electronic system to determine when the temperature exceeds a predetermined temperature threshold. Once the integrated circuit has exceeded the predetermined temperature threshold, that particular portion of the integrated circuit having the specified function is shut down. One such thermal sensing system comprises a thermocouple attached to a heat sink. Another thermal sensing system includes a diode or a bipolar transistor and an external analog circuit. Since the current and voltage characteristics of a diode are temperature dependent, the external analog circuit is used to track the current and voltage characteristics of the diode, while simultaneously monitoring the temperature of the diode. Once the temperature has exceeded a particular value, the external analog circuit generates a signal to trigger the shutting down of that particular function of the electronic system. For a sensing system which includes a bipolar transistor in lieu of the diode, the external analog circuit monitors the base-emitter voltage $V_{be}$ of the transistor since the reference voltage of the bipolar transistor is temperature dependent.

Some thermal sensing systems include hysteresis logic. One such implementation may include a current mirror coupled to a thermal sense element, such as a diode or bipolar transistor. A current reference, having a current proportional to the absolute temperature, generates a bias current which is applied to the current mirror. The bias current and resistance within the thermal sensing circuit is predefined such that the thermal sense element conducts current at a particular predetermined temperature threshold. A typical pre-determined shutdown threshold may be 150° C. In the instance where the thermal element is a bipolar transistor, as noted above, the reference voltage of the bipolar transistor is quite temperature dependent. Its base-emitter voltage $V_{be}$ has a negative temperature coefficient of approximately 1.5 to 2.5 mV/° C. As temperature increases, the base-emitter voltage $V_{be}$ necessary to turn on the bipolar transistor decreases. When the temperature of the circuit reaches the predetermined temperature threshold, the bipolar transistor begins to conduct current. The hysteresis logic switches in additional current applied to the base of the bipolar transistor after the predetermined temperature threshold is reached.

This thermal sense system for protecting an integrated circuit from overheating is successful; however, in many systems, it is desirable to keep all functions available to the end-user. Setting a thermal sense flag eliminates the need to shut down the function entirely. A second thermal sense circuit with a lower detect threshold creates this feature. However, utilizing separate sense elements introduces a semiconductor matching problem where the coefficients associated with the process, die stress, and thermal gradients have a high probability of not being equivalent. In addition, adding a second thermal sense circuit requires a greater portion of die area to incorporate redundant current mirroring required for multiple circuits. This problem escalates when sensing more than two distinct thresholds. Thus, there is a need for a thermal sensing system that utilizes one thermal sensing element having the capability to sense two or more distinct thresholds.

SUMMARY OF THE INVENTION

A temperature sensing system provides at least one detect signal related to temperature in an integrated circuit. This system uses one analog thermal sensing circuit to detect two or more temperature thresholds and differentiates the temperature thresholds using a time multiplexed logic control. The system includes the thermal sensing circuit and a decode circuit with at least two detect latches. Optionally, the system may include a hysteresis circuit. This thermal sensor circuit, connected to the integrated circuit, generates a detect signal in response to a temperature selection signal. This flexible on-board temperature monitoring solution reduces the cost of thermal feedback sensing by reducing die area and improves the correlation of detected temperatures. This solution reduces the possibility of mismatch and tracking errors between two or more sense elements.

There are numerous advantages of the present apparatus of sensing temperature at multiple thresholds over previous implementations. First, the use of a single sense element minimizes the possibility of mismatch and tracking errors between two or more sense elements. This implementation reduces the relative error to current mirror mismatch. The simple time multiplexed decode of the detect signal saves die area verses the implementation of redundant sense circuits; thus, it provides a cost effective solution. Most importantly, with the addition of relatively few components, a time multiplexed method of sensing die temperature results in a flexible on-board temperature monitor.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 4 is a schematic of an embodiment of a thermal sense circuit in accordance with the present invention;

FIG. 5 is a schematic of an embodiment of a detect logic circuit in accordance with the present invention;

FIG. 7 is a schematic of an embodiment of a time multiplexed multiple threshold sensing system with a hysteresis logic circuit;

FIG. 8 is a schematic of an embodiment of a hysteresis logic circuit in accordance with the present invention;

DETAILED DESCRIPTION OF PREFERRED EMBODIMENTS

Figure 1:
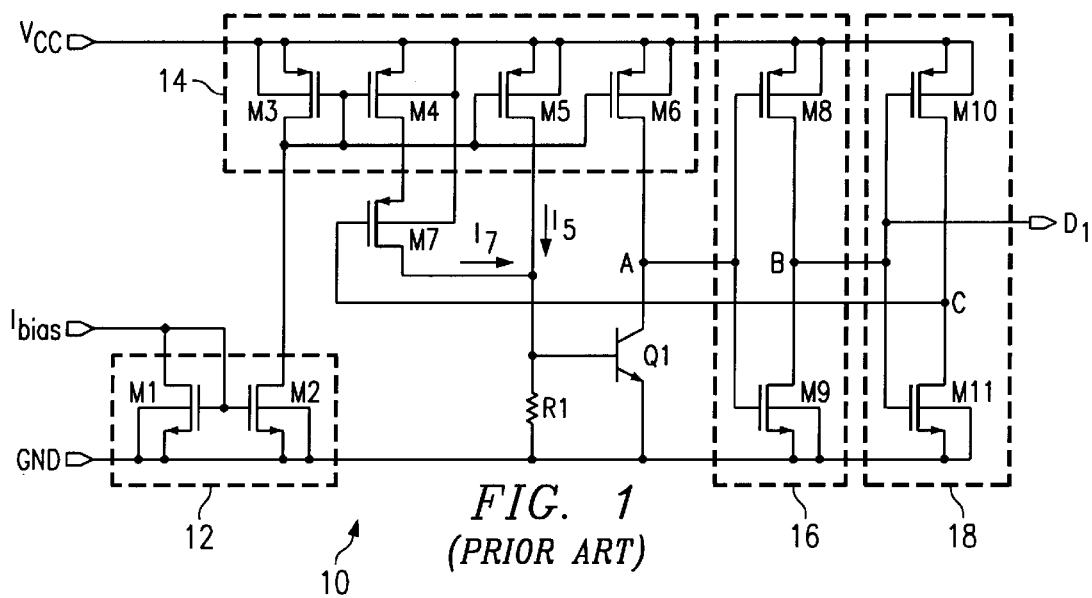
FIG. 1 is a schematic of a known thermal sense circuit.

The present invention is best understood by comparison with the prior art. Hence, this detailed description begins with a discussion of known thermal sensing system 10 which includes hysteresis as shown in FIG. 1. Circuit 10 includes a current source implemented by a current mirror 12 which receives the input bias signal, $I_{bias}$, from a current reference (not shown) having a bias current proportional to absolute temperature. Current mirror 12 includes transistors $M_1$ and $M_2$. The gates of transistors $M_1$ and $M_2$ couple to the drain of transistor $M_1$, which receives the input bias signal $I_{bias}$. The sources of transistors $M_1$ and $M_2$ are grounded. Current mirror 12 is coupled to a multiple output current mirror 14. The multiple output current mirror 14 includes transistors $M_3$, $M_4$, $M_5$ and $M_6$. The gates of transistors $M_3$, $M_4$, $M_5$ and $M_6$ couple to the drain of transistor $M_3$. The current generated at the drains of transistors $M_4$, $M_5$ and $M_6$ provide three output currents. The source of a MOS transistor $M_7$ is coupled to the drain of transistor $M_4$. The drain of transistor $M_7$ is connected to the drain of transistor $M_5$ and the base of a bipolar transistor $Q_1$. A resistor $R_1$ is coupled between the base of bipolar transistor $Q_1$ and ground. The collector of transistor $Q_1$ is coupled to a drain of transistor $M_6$ to form node A. Transistor $Q_1$ serves as the thermal sense element of the thermal sensing system 10. The base-emitter voltage of transistor $Q_1$ has a negative temperature coefficient of approximately 1.5 to 2.5 mV/° C.

Node A is coupled to a first inverting output driver 16. The inverting output driver 16 includes transistors $M_8$ and $M_9$. The gates of both CMOS transistors $M_8$ and $M_9$ are coupled together at node A. The drains of both transistors $M_8$ and $M_9$ are coupled together to form node B. The source of transistor $M_8$ is coupled to the power supply rail $V_{CC}$, while the source of transistor $M_9$ is grounded. An inverter 18 is coupled to the first inverting output driver 16 at node B. Inverter 18 includes transistors $M_{10}$ and $M_{11}$. The gates of both transistors $M_{10}$ and $M_{11}$, are coupled together at node B. The drains of both transistors $M_{10}$ and $M_{11}$, are coupled together. The source of transistor $M_{10}$ is coupled to the power supply rail $V_{CC}$, while the source of transistor $M_{11}$ is grounded. The gate of transistor $M_7$ is connected to the node C, the node common to the drains of both transistors $M_{10}$ and $M_{11}$. The inverting output driver 16 generates a detection signal $D_1$ drawn from node B.

Initially, during a first mode of operation, transistors $M_1$, $M_2$, $M_3$, $M_4$, $M_5$, and $M_6$ are conducting current and transistors $M_9$ and $M_{10}$ are on, while transistors $Q_1$, and $M_7$ are not conducting current and transistors $M_8$ and $M_{11}$, are off. External to the thermal sensing circuit 10, a current reference is generated with a current reference (not shown) having a bias current proportional to absolute temperature. The current reference having a bias current proportional to absolute temperature provides a bias current $I_{bias}$. Current $I_5$ is applied to the base of transistor $Q_1$ and across resistor $R_1$. Prior to the threshold voltage of transistor $Q_1$, the voltage across the resistor $R_1$ equals the current multiplied by the resistance of $R_1$. After the voltage applied to the base of transistor $Q_1$ exceeds the threshold voltage, the voltage across resistor $R_1$ is represented by the following equation:

$$V = kT/q \ln(I_{ref}/I_{sat})$$

where k represents Boltzmann's constant, T is the temperature, q is the charge of an electron, current $I_{sat}$ is the saturation current and current $I_{ref}$ is the reference current or the collector current $I_{C1}$. According to this equation, as temperature increases, the base-emitter voltage $V_{be}$ necessary to turn on the transistor $Q_1$ decreases.

The bias current $I_{bias}$ is set such that when the temperature of the integrated circuit equals the upper threshold temperature $t_1$, transistor $Q_1$ begins to conduct current. A typical pre-determined temperature threshold $t_1$ is 150° C. When the temperature of the integrated circuit reaches the upper threshold temperature $t_1$, transistor $Q_1$ begins to conduct more current than transistor $M_6$ can supply and pulls node A low. As a result, transistor $M_8$ turns on and transistor $M_9$ turns off, pulling the detection signal $D_1$ high. At this point, detection signal $D_1$ may be used to shut down a particular function or perform some other function indicating that the integrated circuit temperature has reached the upper temperature threshold $t_1$.

As noted above, transistors $M_{10}$ and $M_{11}$ define the inverter 18 which is used to apply voltage to the gate of transistor $M_7$ sufficient to enable or disable transistor $M_7$ from conducting current when either the upper or lower predetermined temperature thresholds are reached. Accordingly, together transistors $M_4$, $M_7$, $M_{10}$ and $M_{11}$, form a hysteresis circuit. In a second mode of operation, while detection signal $D_1$ is high, transistor $M_{10}$ turns off and transistor $M_{11}$, turns on. Accordingly, node C goes low, enabling transistor $M_7$ to conduct current. Circuit 10 either shuts down a particular function of the integrated circuit or performs some other function indicating that the integrated circuit temperature has reached the upper temperature threshold $t_1$. At this point, if the integrated circuit is shut down, the integrated circuit begins to cool. Simultaneously, circuit 10 continues to monitor and detect when the temperature of the integrated circuit has reached a lower temperature threshold point $t_0$. As long as the temperature of the integrated circuit remains between the upper and the lower temperature threshold points, $t_0$ and $t_1$, the state of the thermal sense circuit continues to exist as it did at the end of the first mode as explained in the previous paragraph. Particularly, the detection signal $D_1$ remains high, transistors $Q_1$, $M_1$, $M_2$, $M_3$, $M_4$, $M_5$, $M_6$, and $M_7$, continue to conduct current and transistors $M_8$ and $M_{11}$, are on, while transistors $M_9$ and $M_{10}$ are off.

Since transistor $M_7$ conducts current, the current from transistor $M_4$ flows through transistor $M_7$ and currents 15 and 17 are applied to the base of transistor $Q_1$. This cumulative current alters the base-emitter voltage $V_{BE}$ of transistor $Q_1$ to be the voltage sufficient to turn on transistor $Q_1$ when the temperature of the integrated circuit equals the lower threshold temperature $t_0$. Thus, the moment the temperature of the integrated circuit falls to the lower threshold temperature $t_0$, transistor $Q_1$ ceases to conduct current. Transistor $M_6$ pulls node A high. Transistor $M_8$ turns off and transistor $M_9$ turns on, pulling the detection signal $D_1$ low. At this point, detection signal $D_1$ may be used to turn the once shut down integrated circuit back on. Transistor $M_{10}$ turns on and transistor $M_{11}$ turns off. Node C goes high, turning transistor $M_7$ off. At this point, the thermal sensing circuit 10 returns to the first mode of operation, detecting a rise in temperature at the upper temperature threshold $t_1$ as explained above. The circuit 10 continues to operate in this cyclic fashion.

The disadvantage with this embodiment is that there is no way to determine exactly when the temperature of the integrated circuit equals the lower temperature threshold to when the temperature is rising. In addition, it is not always desirable to shut down a integrated circuit.

Figure 2:
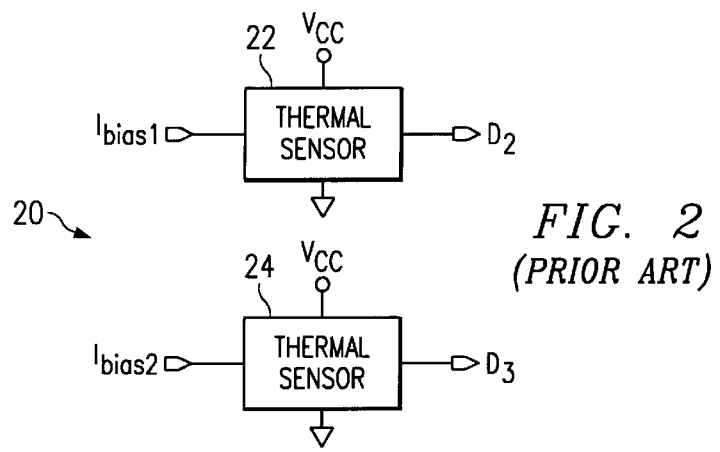
FIG. 2 is a block diagram of a known thermal sense circuit having multiple sense elements.

This thermal sense circuit that protects an integrated circuit from overheating is successful; however, in many systems, it is desirable to keep all functions available to the end-user. Setting a thermal sense flag eliminates the need to shut down the function entirely. This thermal sense flag can be used by external or internal circuitry to selectively reduce the power consumption of the integrated circuit in an effort to prevent overheating. As depicted in FIG. 2, a second thermal sense circuit 24 with a lower detect threshold creates this feature. The thermal sense system 20 includes two thermal sense circuits 22 and 24. These circuits 22 and 24 are equivalent in design to the thermal sensing circuit 10 as shown in FIG. 1. The input bias signal $I_{bias1}$ is coupled to the input of the first thermal sensing circuit 22. The input bias signal $I_{bias2}$ is coupled to the input of the second thermal sensing circuit 24. The bias current signals, $I_{bias1}$, and $I_{bias2}$, propagate from either the same current reference or two separate current references (not shown). The first thermal sensor circuit 22 generates a first detection signal $D_2$ while the second thermal sensing circuit 24 generates a second detection signal $D_3$.

The use of separate sense elements, however, introduces the problem of matching the process, die stress, and thermal gradients between the two sense elements. Additional die area for the redundant current mirroring required for multiple circuits increases cost and power consumption. The problem is excessive when sensing two or more distinct thresholds.

Figure 3:
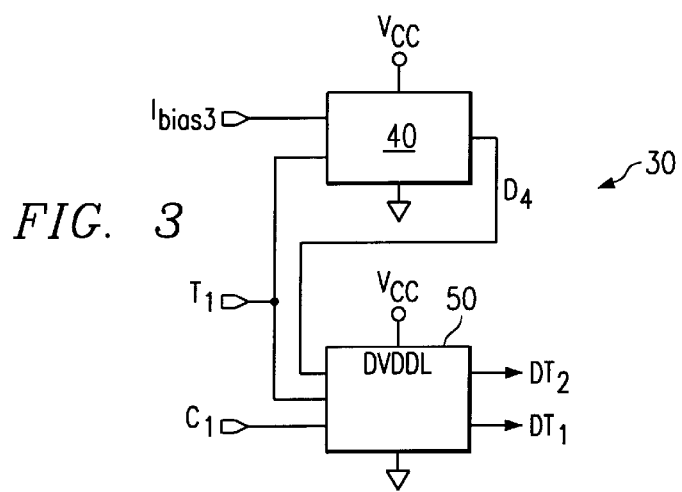
FIG. 3 is a block diagram of an embodiment of a time multiplexed multiple threshold sensing system with a single sense element in accordance with the present invention.

The thermal sense system 30 is an embodiment in accordance with the present invention as shown in FIG. 3 includes a thermal sensing circuit 40 and a decode circuit 50 having two detect latches. The detection clock signal $C_1$ runs at a higher frequency than the temperature selection clock signal $T_1$. For example, detection clock signal $C_1$ can be ten times as fast as the temperature selection clock signal $T_1$. The input signal $I_{bias3}$ is coupled to the thermal sensing circuit 40 at its input for providing a voltage bias for the thermal sense element of thermal sensing circuit 40. The temperature selection clock signal $T_1$ is coupled to the thermal sensing circuit 40 and the decode circuit 50 for selectively clocking the two temperature detection modes of operation. The thermal sensing circuit 40 generates a detection signal $D_4$. This detection signal $D_4$ signal couples to the decode circuit 50 at is input. The decode circuit determines which threshold temperature has been reached, either the first temperature threshold $t_2$ or the second temperature threshold $t_3$. The detection clock signal $C_1$ is coupled to the decode circuit 50 to provide a clocking signal. The decode circuit 50 generates two output signals $DT_1$ and $DT_2$. These signals coupled to the hysteresis logic circuit 60 (to be discussed in a later paragraph with regard to FIG. 8) to generate a shutdown flag, $S_1$.

The thermal sensing circuit 40 in FIG. 4 includes a current source implemented by a first current mirror 42, multiple output current mirror 44, a MOSFET transistor $M_{48}$, a resistor $R_2$, a bipolar transistor $Q_{10}$, and an inverting output driver 46. Current mirror 42 receives the input bias signal, $I_{bias3}$. Current mirror 42 includes transistors $M_{40}$ and $M_{42}$. The gates of transistors $M_{40}$ and $M_{42}$ couple to the drain of transistor $M_{40}$, which receives the input bias signal $I_{bias3}$. The sources of transistors $M_{40}$ and $M_{42}$ are grounded. Current mirror 42 is coupled to the multiple output current mirror 44. The multiple output current mirror 44 includes transistors $M_{44}$, $M_{46}$, $M_{50}$ and $M_{52}$. The gates of transistors $M_{44}$, $M_{46}$, $M_{50}$ and $M_{52}$ couple to the drain of transistor $M_{44}$. The drain of transistor $M_{44}$ couples to the drain of transistor $M_{42}$. The sources of transistors $M_{44}$, $M_{46}$, $M_{50}$ and $M_{52}$ couple to a power supply $V_{CC}$. The current generated at the drains of transistors $M_{48}$, $M_{50}$ and $M_{52}$ provide three output currents. The source of transistor $M_{48}$ is coupled to the drain of transistor $M_{46}$, while the gate of transistor $M_{48}$ is coupled to the temperature selection signal $T_1$. The drain of transistor $M_{48}$ is connected to the drain of transistor $M_{50}$ and the base of a bipolar transistor $Q_{10}$. A resistor $R_2$ is coupled between the base of bipolar transistor $Q_{10}$ and ground. The collector of transistor $Q_{10}$ is coupled to a drain of transistor $M_{52}$ to form node D. Transistor $Q_{10}$ serves as the thermal sense element of the thermal sensing system 40. Transistor $Q_{10}$ has a negative temperature coefficient of approximately 1.5 to 2.5 mV/° C.

Node D is coupled to the inverting output driver 46. The inverting output driver 46 includes transistors $M_{54}$ and $M_{56}$. The gates of both transistors $M_{54}$ and $M_{56}$ are coupled together at node D. The drains of both transistors $M_{54}$ and $M_{56}$ are coupled together to form node E. The source of transistor $_{54}$ is coupled to the power supply rail $V_{CC}$, while the source of transistor $M_{56}$ is grounded. The inverting output driver generates a detection signal $D_4$ at node E.

Initially, during a first mode of operation, transistors $M_{40}$, $M_{42}$, $M_{44}$, $M_{46}$, and $M_{50}$, are conducting current and transistors $M_{52}$, and $M_{56}$ are on, while transistors $Q_{10}$, and $M_{48}$ are not conducting current and transistor $M_{54}$ is off. External to the thermal sensing circuit 40, a voltage reference is generated with a current reference (not shown) having a bias current proportional to absolute temperature. The a current reference having a bias current proportional to absolute temperature provides a bias current $I_{bias3}$ Current $I_{50}$ is applied to the base of transistor $Q_{10}$ and across resistor $R_2$. Prior to the threshold voltage of transistor $Q_{10}$, the voltage across the resistor $R_2$ equals the current multiplied by the resistance of $R_2$. After the voltage applied to the base of transistor $Q_{10}$ exceeds the threshold voltage, the voltage across resistor $R_2$ is represented by the following equation:

$$V = kT/q \ln(I_{ref}/I_{sat})$$

where k represents Boltzmann's constant, T is the temperature, q is the charge of an electron, current $I_{sat}$ is the saturation current and current $I_{ref}$ is the reference current or the collector current $I_{C10}$. As temperature increases, the base-emitter voltage $V_{be}$ necessary to turn on the transistor $Q_{10}$ decreases. A typical predetermined temperature threshold $t_1$ is 150° C.

By setting a proper ratio of current mirrors and resistance in the thermal sensing circuit 40, transistor $Q_{10}$ begins to conduct current at the desired temperature. The definition of the size of resistor $R_2$ and transistors $M_{50}$ and $M_{46}$ create the two temperature threshold points: an upper temperature threshold $t_3$ and a lower temperature threshold $t_2$. An example may include the use of two threshold points, an upper at 150° C. and a lower at 125° C.

The bias current $I_{bias3}$ is set such that when the temperature of the integrated circuit equals the upper threshold temperature $t_3$, transistor $Q_{10}$ begins to conduct current. When the temperature of the integrated circuit reaches the upper threshold temperature $t_3$, transistor $Q_{10}$ begins to conduct current and pulls node D low. As a result, transistor $M_{54}$ turns on and transistor $M_{56}$ turns off, pulling the detection signal $D_4$ high. At this point, detection signal $D_4$ may be used to shut down a particular function or perform some other function indicating that the integrated circuit temperature has reached the upper temperature threshold $t_3$.

The temperature selection signal $T_1$ controls when the circuit detects the upper or lower temperature thresholds, $t_3$ and $t_2$, respectively. The temperature selection clock signal $T_1$ toggles between zero and one to adjust the current applied to the base of transistor $Q_{10}$. When the current applied to the base of transistor $Q_{10}$ increases, the base-emitter voltage $V_{be}$ necessary to turn on the transistor $Q_{10}$ decreases. Accordingly, the lower temperature threshold $t_2$ is set thereby. Specifically, when the temperature selection clock signal $T_1$ toggles to zero, the lower temperature threshold $t_2$ is set. When the temperature selection clock signal $T_1$ toggles to one, the upper temperature threshold $t_3$ is set. As a result, the temperature selection clock signal $T_1$ determines at which temperature the detection signal $D_4$ will go high. For the circuit shown, when temperature selection clock signal $T_1$ is high, transistor $M_{48}$ is not conducting current. The current through transistor $M_{50}$ is applied across resistor $R_2$. The thermal voltage for transistor $Q_{10}$ corresponds to the upper temperature threshold $t_3$. The detection signal $D_4$ will go high when temperature equals this upper temperature threshold $t_3$. When the temperature selection clock signal $T_1$ is low, transistor $M_{48}$ is turned on and the current through both transistors $M_{50}$ and $M_{48}$ are applied across resistor $R_2$, raising the voltage across resistor $R_2$. Thus, the thermal voltage for transistor $Q_{10}$ decreases to the lower temperature threshold $t_2$. The detection signal $D_4$ will go high when temperature equals this lower temperature threshold $t_2$.

A schematic for the decode circuit 50 with two detect latches is shown in FIG. 5. The decode circuit 50 includes three inverters 52, 58, and 60, two NAND gates 54 and 56 and two flip-flop registers 62 and 64. Inputs to the detect circuit 50 include the detection signal $D_4$ from the thermal sensing circuit 40, temperature selection clock signal $T_1$, and a detection clock signal $C_1$. The first NAND gate 54 receives two input signals: the detection clock signal $C_1$ and the temperature selection clock signal $T_1$. The output of the first NAND gate 54 couples to the input of inverter 58. The output of inverter 58 couples to the clock input of the flip-flop register 62. The second NAND gate 56 receives the detection clock signal $C_1$ and an inverted temperature selection clock signal $T_1$, which is inverted by inverter 52. The output of the second NAND gate 56 is coupled to the inverter 60. The output of the inverter 60 couples to the clock signal input of flip-flop register 64. The detection signal $D_4$ is coupled to the input ports of both flip-flop registers 62 and 64. Flip-flop registers 62 and 64 produce output signals $DT_1$ and $DT_2$, respectively. These output signals, $DT_1$ and $DT_2$, correspond to lower and upper temperature thresholds, $t_2$ and $t_3$, respectively. The temperature selection clock signal $T_1$ is used to mask or pass the detection clock signal $C_1$ to the detection latches, $DT_1$ and $DT_2$. If the detection signal $D_4$ is high while the temperature selection clock signal $T_1$ is low, then the detection latch $DT_1$ is set. If detection signal $D_4$ is high while temperature selection clock signal $T_1$ is high, then the detection latch $DT_2$ is set.

By alternating temperature selection clock signal $T_1$ at some frequency (i.e. 25 kHz) and detection clock signal $C_1$ at a sufficiently higher frequency (i.e. 200 kHz), the thermal latch outputs $DT_1$ and $DT_2$ can be decoded to determine whether the die is below the lower temperature threshold $t_2$, between upper and lower temperature thresholds, $t_3$ and $t_2$, or greater than the upper temperature threshold $t_3$. With thermal latch $DT_1$ as the most significant bit (MSB) and thermal latch $DT_2$ as the least significant bit (LSB), these temperature ranges correspond to '00', '01', '10', and '11' appearing on the detection latch outputs, $DT_1$ and $DT_2$.

Figure 6:
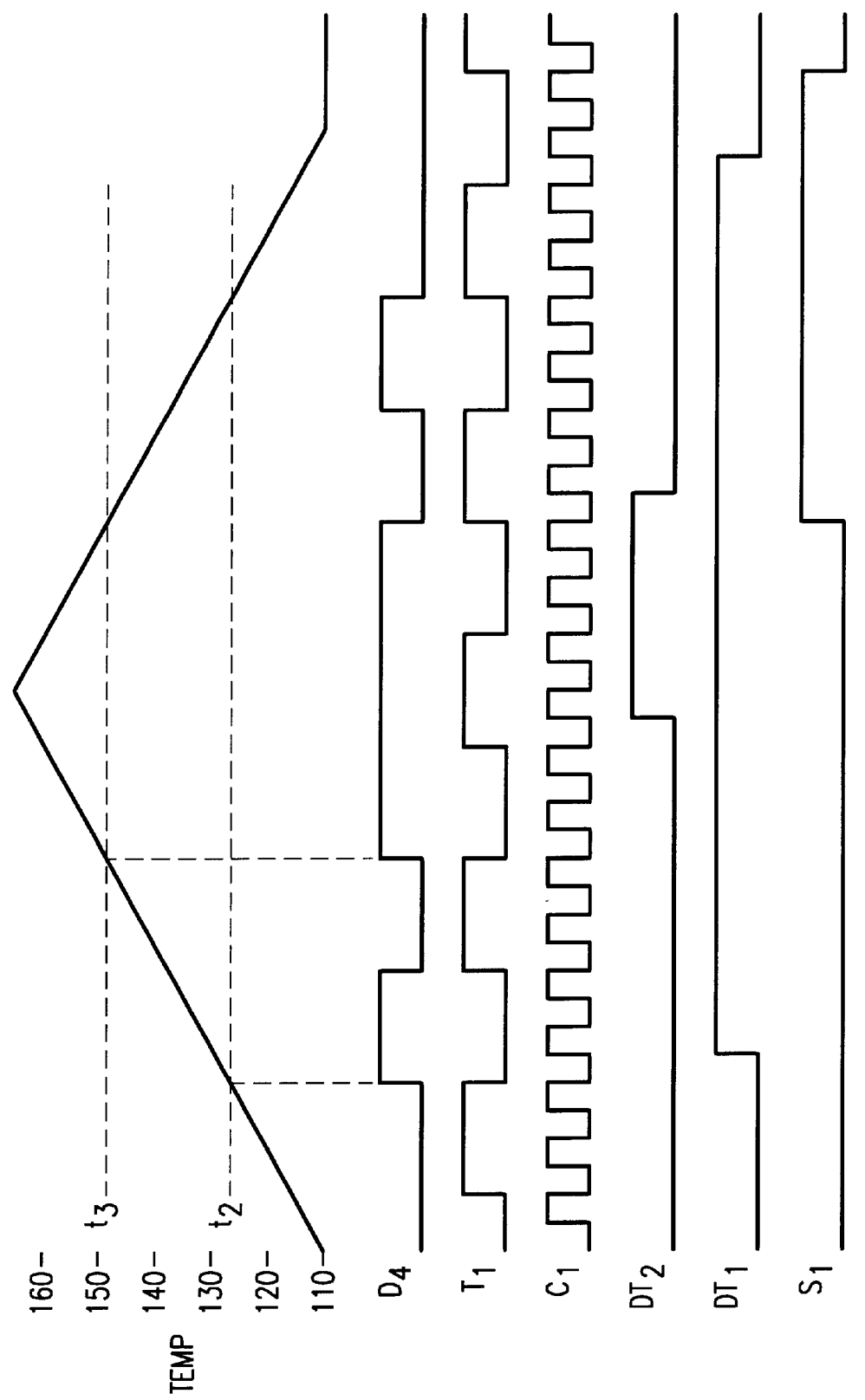
FIG. 6 is a timing/temperature multiplexed diagram of dual temperature threshold sensing of the threshold sensing system of FIG. 3.

A diagram demonstrating the time multiplexed dual temperature threshold sensing with a single element according to FIG. 3 is shown in FIG. 6. As can be seen, when the temperature selection clock signal $T_1$ toggles to zero, the lower temperature threshold is set. When the temperature selection clock signal $T_1$ toggles to one, the upper temperature threshold is set. As a result, the temperature selection clock signal $T_1$ determines at which temperature the detection signal $D_4$ will go high. Consequently, when the temperature selection clock signal $T_1$ is low, the detection signal $D_4$ will go high when temperature equals this lower temperature threshold $t_2$. When temperature selection clock signal $T_1$ is high, the detection signal $D_4$ will go high when temperature equals this upper temperature threshold $t_3$. The temperature selection clock signal $T_1$ is used to mask or pass the detection clock signal $C_1$ to the detection latches, $DT_1$ and $DT_2$. If the detection signal $D_4$ is high while the temperature selection clock signal $T_1$ is low, then the detection latch $DT_1$ is set. If detection signal $D_4$ is high while temperature selection clock signal $T_1$ is high, then the detection latch $DT_2$ is set.

FIG. 7 depicts an embodiment according to the present invention that includes a hysteresis logic circuit 60 coupled to decode circuit 50. The temperature selection clock signal $T_1$ and the detection latch outputs, $DT_1$ and $DT_2$ couple to the hysteresis logic circuit 60 to generate a shutdown flag, $S_1$.

The hysteresis logic circuit 60 as shown in FIG. 8 includes an inverter 66, two NOR gates 68 and 70, and a flip-flop register 72. The inverter 66 receives the thermal latch signal $DT_2$. The NOR gate 68 receives the thermal latch signal $DT_1$ and the shutdown signal, $S_1$. The outputs of inverter 66 and NOR gate 68 are coupled to the inputs of NOR gate 70. The output of NOR gate 70 is fed into the input of flip-flop register 72 and the temperature selection signal $T_1$ into the clock signal input. The flip-flop register 72 generates a thermal shutdown signal, $S_1$. This signal is fed back to one input of NOR gate 68 as noted above. Thermal shutdown occurs when both latch signals $DT_1$ and $DT_2$ have been detected. However, to implement hysteresis, the shutdown bit cannot be cleared until both the detection latches signals, $DT_1$ and $DT_2$, are cleared. Referring back to FIG. 6, note that when both detection latches signals, $DT_1$ and $DT_2$, are high, the thermal shutdown signal $S_1$ is set.

Figure 9:
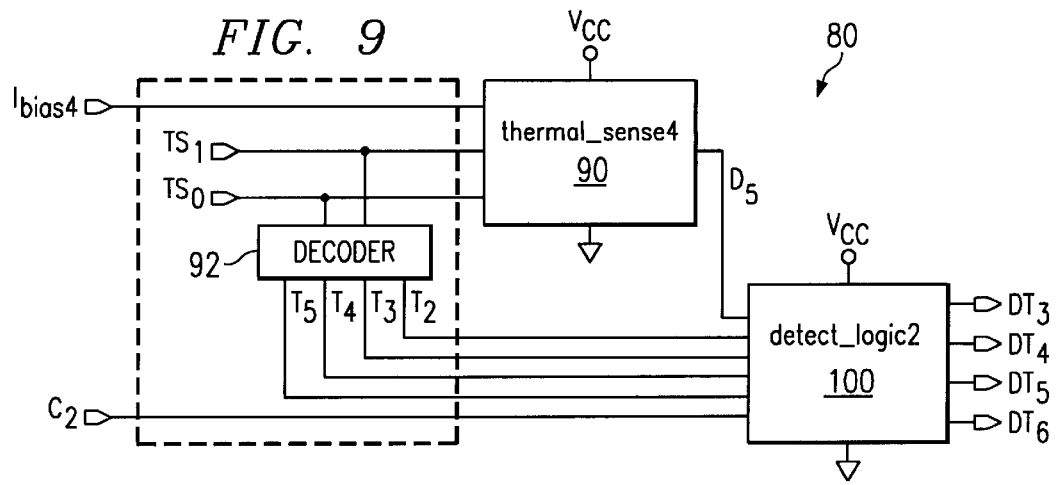
FIG. 9 is a block diagram of an embodiment of a multiple threshold sensing system in accordance with the present invention.

The two temperature threshold circuits can easily be modified for multiple thresholds by adding a threshold switch, a current source, and a detect latch for each temperature threshold as shown in FIG. 9. Specifically, the thermal sensor system 80 includes a thermal sense circuit 90, a decoder 92, and a detect circuit 100. The thermal sense circuit 90 receives the input bias signal, $I_{bias4}$, and two temperature selection clock signals, $TS_0$ and $TS_1$, to generate a detection signal $D_5$. Decoder 92 decodes the two temperature selection clock signals $TS_0$ and $TS_1$ into signals $T_2$, $T_3$, $T_4$, and $T_5$. The detection clock signal $C_2$ provides the clocking for signals of the circuit 80. Detection signal $D_5$ and signals $T_2$, $T_3$, $T_4$, and $T_5$ are fed into the detection circuit 100 to generate threshold latch signals $DT_3$, $DT_4$, $DT_5$, and $DT_6$. By synchronous decoding of the thermal sensing circuit 90 and setting of the threshold latch signals $DT_3$, $DT_4$, $DT_5$, and $DT_6$, the die temperature or relative die temperature change can be determined within the ranges of the various sense thresholds.

Figure 10:
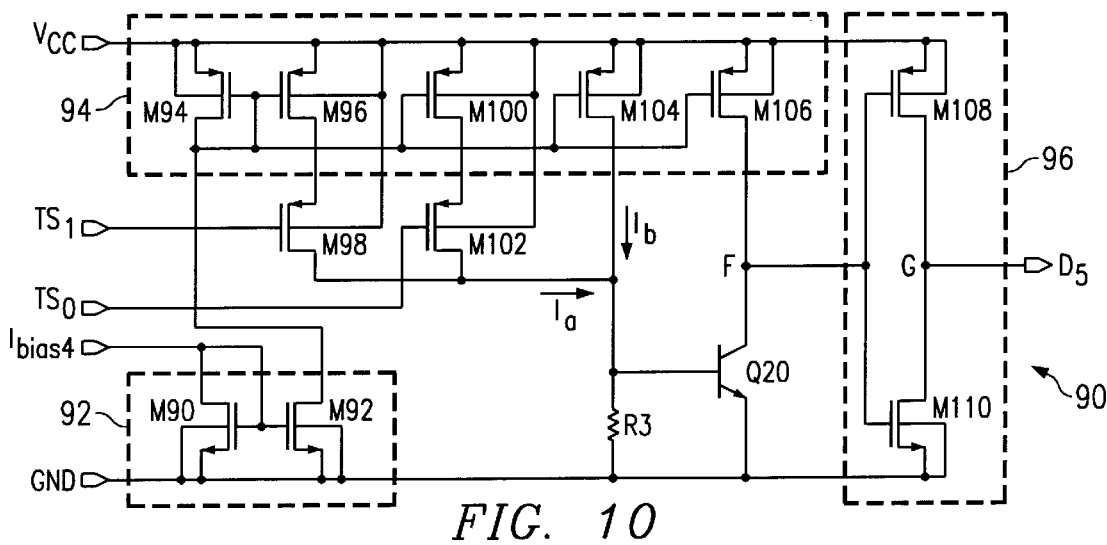
FIG. 10 is a schematic of an embodiment of a multiple threshold temperature sensor circuit in accordance with the present invention.

The thermal sense circuit 90 is shown in FIG. 10. Circuit 90 includes a current source implemented by a current mirror 92, multiple output current mirror 94, a first MOS transistor $M_{98}$, a second MOS transistor $M_{102}$, a bipolar transistor $Q_{20}$, a resistor $R_3$ and an inverting output driver 96. Current mirror 92 includes transistors $M_{90}$ and $M_{92}$. The gates of transistors $M_{90}$ and $M_{92}$ couple to the drain of transistor $M_{90}$, which receives the input bias signal $I_{bias4}$. The sources of transistors $M_{90}$ and $M_{92}$ are grounded. Current mirror 92 is coupled to the multiple output current mirror 94. Multiple output current mirror 94 includes transistors $M_{94}$, $M_{96}$, $M_{100}$ $M_{104}$ and $M_{106}$. The gates of transistors $M_{94}$, $M_{96}$, $M_{100}$ $M_{104}$ and $M_{106}$ couple to the drain of transistor $M_{94}$. The drain of transistor $M_{94}$ couples to the drain of transistor $M_{92}$. The sources of transistors $M_{94}$, $M_{96}$, $M_{100}$ $M_{104}$ and $M_{106}$ couple to a power supply $V_{CC}$. The current generated at the drains of transistors $M_{96}$, $M_{100}$ $M_{104}$ and $M_{106}$ provide four output currents. The source of transistor $M_{98}$ is coupled to the drain of transistor $M_{96}$, while the gate of transistor $M_{98}$ is coupled to the temperature selection signal $TS_1$. The source of transistor $M_{102}$ is coupled to the drain of transistor $M_{100}$, while the gate of transistor $M_{102}$ is coupled to the temperature selection signal $TS_0$. The drains of transistors, $M_{98}$, $M_{102}$, and $M_{104}$, are connected to the base of a bipolar transistor $Q_{20}$. A resistor $R_3$ is coupled between the base of bipolar transistor $Q_{20}$ and ground. The collector of transistor $Q_{20}$ is coupled to a drain of transistor $M_{106}$ to form node F. Transistor $Q_{20}$ serves as the thermal sense element of the thermal sensing system 90. Transistor $Q_{20}$ has a negative temperature coefficient of approximately 1.5 to 2.5 mV/° C.

Node F is coupled to the inverting output driver 96. The inverting output driver 96 includes transistors $M_{108}$ and $M_{110}$. The gates of both transistors $M_{108}$ and $M_{110}$ are coupled together at node F. The drains of both transistors $M_{108}$ and $M_{110}$ are coupled together to form node G. The source of transistor $M_{108}$ is coupled to the power supply rail $V_{CC}$, while the source of transistor $M_{110}$ is grounded. The inverting output driver generates a detection signal $D_5$ at node G.

Initially, during a first mode of operation, transistors $M_{90}$, $M_{92}$, $M_{94}$, $M_{96}$, $M_{100}$, $M_{104}$, and $M_{106}$ are conducting current and transistor $M_{110}$ is on, while transistors $Q_{20}$ $M_{98}$, and $M_{102}$ are not conducting current and transistor $M_{108}$ is off. External to the thermal sensing circuit 90, a voltage reference is generated with a current reference (not shown) having a bias current proportional to absolute temperature. The a current reference having a bias current proportional to absolute temperature provides a bias current $I_{bias4}$ Current $I_b$ is applied to the base of transistor $Q_{20}$ and across resistor $R_3$. Prior to the threshold voltage of transistor $Q_{20}$, the voltage across the resistor $R_3$ equals the current multiplied by the resistance of $R_3$. After the voltage applied to the base of transistor $Q_{20}$ exceeds the threshold voltage, the voltage across resistor $R_3$ is represented by the following equation:

$$V = kT/q \ln(I_{ref}/I_{sat})$$

where k represents Boltzmann's constant, T is the temperature, q is the charge of an electron, current $I_{sat}$ is the saturation current and current $I_{ref}$ is the reference current or the collector current $I_{C20}$. As temperature increases, the base-emitter voltage $V_{be}$ necessary to turn on the transistor $Q_{20}$ decreases. By setting a proper ratio of current mirrors and resistance in the thermal sensing circuit 90, transistor $Q_{20}$ begins to conduct current at the desired temperature. The definition of the size of resistor $R_3$ and transistors $M_{98}$, $M_{102}$, and $M_{104}$ create the two temperature threshold points of $t_2$, $t_3$, $t_4$ and $t_5$.

The bias current $I_{bias4}$ is set such that when the temperature of the integrated circuit equals the upper threshold temperature $t_5$, transistor $Q_{20}$ begins to conduct current. Thus, when the temperature of the integrated circuit reaches the upper threshold temperature $t_5$, transistor $Q_{20}$ begins to conduct current and pulls node F low. As a result, transistor $M_{108}$ turns on and transistor $M_{110}$ turns off, pulling the detection signal $D_5$ high.

The temperature selection signals $TS_1$ and $TS_2$ control when the circuit detects the temperature thresholds, $t_2$, $t_3$, $t_4$ and $t_5$. Both temperature selection clock signals $TS_1$ and $TS_2$ toggle between zero and one to adjust the current applied to the base of transistor $Q_{20}$. When the current applied to the base of transistor $Q_{20}$ increases, the base-emitter voltage $V_{be}$ necessary to turn on the transistor $Q_{20}$ decreases. Specifically, there are four states given the combination of the two temperature selection clock signals $TS_0$ and $TS_1$: '00', '01', '10', '11'; where the most significant bit is $TS_1$ and the least significant bit is $TS_0$.

Given that signals $TS_0$ and $TS_1$ are both zero, the lower temperature threshold $t_2$ is set. Transistors $M_{98}$ and $M_{102}$ are conducting current. Therefore, current through transistors $M_{98}$ and $M_{102}$ combine to form current $I_a$ Accordingly, current $I_b$ through transistor $M_{104}$ combines with $I_a$ to be applied to the base of transistor $Q_{20}$. At this point, the thermal voltage for transistor $Q_{20}$ corresponds to the lower temperature threshold $t_2$. Thus, the detection signal $D_5$ will go high when the temperature of the integrated circuits equals the lower temperature threshold $t_2$.

Given signal $T_D$ is a one and signal $TS_1$ is a zero, the temperature threshold $t_3$ is set. Transistors $M_{98}$ is conducting current and $M_{102}$ is not conducting current. Current $I_a$ comprises the current through transistor $M_{98}$ solely. When the combined currents of $I_b$ and $I_a$ are applied to the base of transistor $Q_{20}$, the thermal voltage of transistor $Q_{20}$ corresponds to the temperature threshold $t_3$. Detection signal $D_5$ will go high when the temperature of the integrated circuits equals the lower temperature threshold $t_3$.

When signal $TS_0$ is a zero and signal $TS_1$ is a one, the temperature threshold $t_4$ is set. Transistors $M_{98}$ is not conducting current and $M_{102}$ is conducting current. Current $I_a$ comprises the current through transistor $M_{102}$. When the combined currents of $I_b$ and $I_a$ are applied to the base of transistor $Q_{20}$, the thermal voltage of transistor $Q_{20}$ corresponds to the temperature threshold $t_4$. Detection signal $D_5$ will go high when the temperature of the integrated circuits equals the lower temperature threshold $t_4$.

Given signals that $TS_0$ and $TS_1$ are both one, the upper temperature threshold $t_5$ is set. Transistors $M_{98}$ and $M_{102}$ are not conducting current and $I_a$ is 0. When current $I_b$ is applied to the base of transistor $Q_{20}$, the thermal voltage of transistor $Q_{20}$ corresponds to the temperature threshold $t_5$. Detection signal $D_5$ will go high when the temperature of the integrated circuits equals the lower temperature threshold $t_5$.

Figure 11:
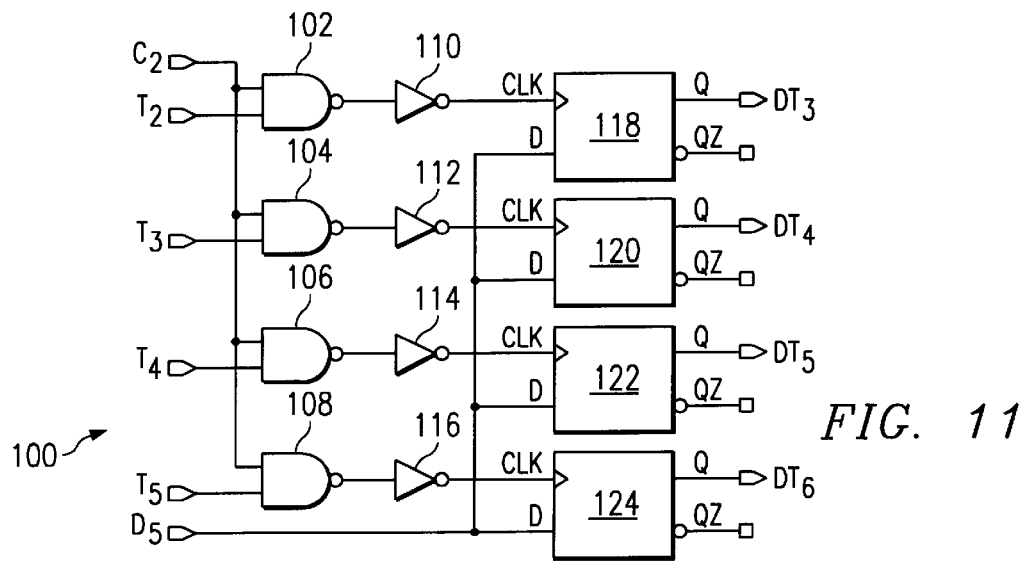
FIG. 11 is a schematic of an embodiment of a multiple detect logic circuit in accordance with the present invention.

The decode circuit 100 as shown in FIG. 11 includes four NAND gates 102, 104, 106, and 108, four inverters 110, 112, 114 and 116, and four flip flop registers 118, 120, 122, and 124. Signals $TS_0$ and $TS_1$ are applied to the decoder 92 (shown in FIG. 9) to generate decoded temperature selection signals $T_2$, $T_3$, $T_4$, and $T_5$. Signals $T_2$, $T_3$, $T_4$, and $T_5$ correspond to temperature thresholds $t_2$, $t_3$, $t_4$, and $t_5$. The detection clocking signal $C_2$ and the temperature selection signal $T_2$ are coupled to the inputs of NAND gate 102. The detection clocking signal $C_2$ and the temperature selection signal $T_3$ are coupled to the inputs of NAND gate 104. The detection clocking signal $C_2$ and the temperature selection clock signal $T_4$ are coupled to the inputs of NAND gate 106. The detection clocking signal $C_2$ and the temperature selection clock signal $T_5$ are coupled to the inputs of NAND gate 108. The outputs of NAND gates 102, 104, 106, and 108 are fed into inverters 110, 112, 114 and 116 respectively. The outputs of inverters 110, 112, 114 and 116 are fed into the clock inputs of flip flop registers 118, 120, 122 and 124, respectively. The detection signal $D_5$ is fed into the input of each flip flop register, 118, 120, 122, and 124. Flip flop registers 118, 120, 122, and 124 generate output signals $DT_3$, $DT_4$, $DT_5$, and $DT_6$, respectively.

Figure 12:
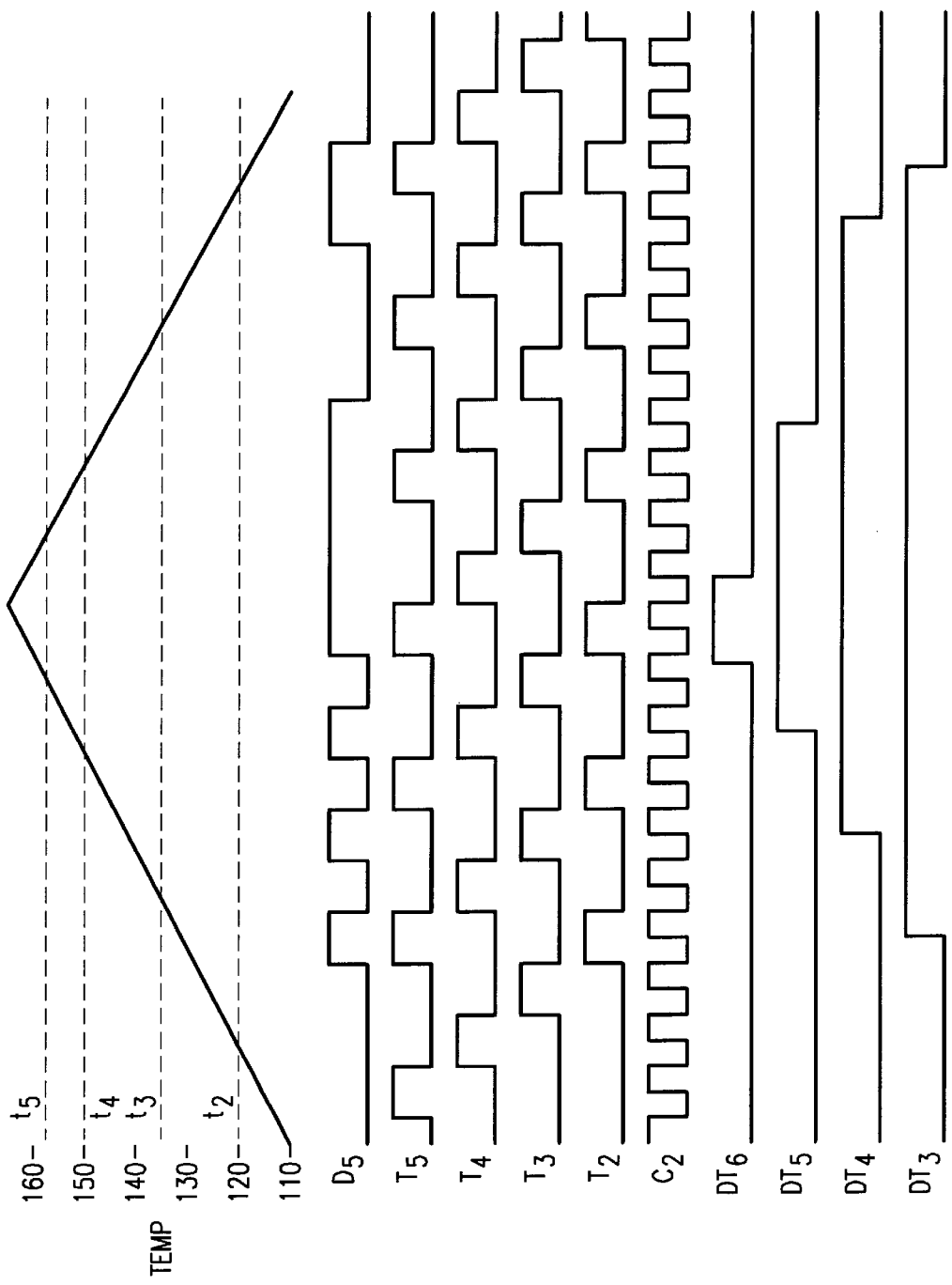
FIG. 12 is a timing/temperature multiplexed diagram of multiple temperature threshold sensing of the multiple threshold sensing system of FIG. 9.

A timing diagram demonstrating the time multiplexed dual temperature threshold sensing with a single element according to FIG. 9 is shown in FIG. 12. The temperature selection signals $TS_1$ and $TS_2$ control when the circuit detects the temperature thresholds, $t_2$, $t_3$, $t_4$ and $t_5$. Specifically, there are four states given the combination of the two temperature selection clock signals $TS_0$ and $TS_1$: '00', '01', '10', '11'. Given signals $TS_0$ and $TS_1$ are both zero, the lower temperature threshold $t_2$ is set. Detection signal $D_5$ will go high when the temperature of the integrated circuits equals the lower temperature threshold $t_2$. Detection latch $DT_3$ will go high as well. When signal $TS_0$ is a one and signal $TS_1$ is a zero, the temperature threshold $t_3$ is set. Detection signal $D_5$ will go high when the temperature of the integrated circuits equals the temperature threshold $t_3$. Accordingly, detection latch $DT_4$ will go high. When signal $TS_0$ is a zero and signal $TS_1$ is a one, the temperature threshold $t_4$ is set. Detection signal $D_5$ will go high when the temperature of the integrated circuits equals the temperature threshold $t_4$. In addition, detection latch $DT_5$ will go high. Given signals $TS_0$ and $TS_1$ are both one, the upper temperature threshold $t_5$ is set. Detection signal $D_5$ will go high when the temperature of the integrated circuits equals the temperature threshold $t_5$. As a result, detection latch $DT_6$ will go high.

This flexible on-board temperature monitoring solution reduces the cost of thermal feedback sensing by reducing die area and improves the correlation of detected temperatures. In addition, this solution reduces the possibility of mismatch and tracking errors between two or more sense elements.

Further scope of applicability of the present invention should become apparent from the detailed description given above. However, it should be understood that the detailed description and specific examples, while indicating embodiments of the invention, are given by way of illustration only, since various changes and modifications within the spirit and scope of the invention should become apparent to those skilled in the art from this detailed description. Accordingly, this detailed description and specific examples are not to be considered as limiting the present invention.

What is claimed is:

1. A thermal sensing system for an integrated circuit comprising:

a thermal sensing circuit, having a first input for a voltage bias and a second input for a temperature selection clock signal $T_1$, the thermal sensing circuit for monitoring the temperature $t_0$ of the integrated circuit for a temperature in between a first $t_1$ and a second $t_2$ threshold temperature range, wherein if $t_1 \leq t_0 \leq t_2$, the thermal sensing circuit generates at least one detection signal;

a decode circuit, having a first input, a second input, a first detect latch output, and a second detect latch output, the decode circuit coupled to the thermal sensing circuit for receiving the at least one detection signal to determine whether the first $t_1$ and second $t_2$ threshold temperature has been reached and generating at least one detection flag signal at a predetermined threshold temperature, the first input coupled to receive the temperature selection clock signal $T_1$, the second input coupled to receive the a detection clock signal $C_1$, wherein the detection clock signal $C_1$ has a higher frequency than that of the temperature selection clock signal $T_1$; and a hysteresis circuit coupled to the first and second detect latch outputs for receiving the at least one detection flag and generating a shutdown signal to selectively reduce the power consumption of the integrated circuit to prevent overheating.

2. The thermal sense system according to claim 1, wherein the thermal sense circuit includes a current source;

a multiple output current mirror having an input lead and at least three output leads, the input lead coupled to the current source;

a MOSFET transistor having a gate, a source and a drain, the source coupled to the first output of the multiple output current mirror for receiving current;

a bipolar transistor having a base, collector, and emitter, the base coupled to the second output of the multiple output current mirror and drain of the MOSFET transistor, the collector coupled to the third output of the multiple output current mirror;

a resistor coupled between the base of the bipolar transistor and ground; and an inverting output driver for generating the detection signal, the inverting output driver coupled to the collector of the bipolar transistor.

3. The thermal sense circuit according to claim 2, wherein the multiple output current mirror having an input and three outputs includes a first MOS transistor having a source, drain and gate, the source coupled to the power supply rail, the drain and gate coupled to the input of the multiple output current mirror;

a second MOS transistor having a source, drain and gate, the source coupled to the power supply rail, the drain coupled to the first output of the multiple output current mirror, the gate coupled to the gate of the first MOS transistor;

a third MOS transistor having a source, drain and gate, the source coupled to the power supply rail, the drain coupled to the second output of the multiple output current mirror, the gate coupled to the gate of the first MOS transistor; and a fourth MOS transistor having a source, drain and gate, the source coupled to the power supply rail, the drain coupled to the third output of the multiple output current mirror, the gate coupled to the gate of the first MOS transistor.

4. The thermal sense circuit according to claim 2, wherein the inverting output driver includes a first MOS transistor having a source, drain and gate, the source coupled to the power supply rail and a second MOS transistor having a source, drain and gate, the source coupled to ground, the gate coupled to the gate of the first MOS transistor, the drain coupled to the drain of the first MOS transistor to form a detection signal node.

5. The thermal sensing system according to claim 1, wherein the decode circuit includes a first and second NAND gate, each NAND gate having at least two inputs and at least one output, the first input of the first NAND gate coupled to the detection clock signal, the second input of the first NAND gate coupled to the temperature selection clock signal, the first input of the second NAND gate coupled to the first input of the first NAND gate;

a first inverter having an input and an output, the input coupled to the temperature selection signal, the output coupled as the second input of the second NAND gate;

a second and third inverter each having an input and an output, the input of the second inverter coupled to the output of the first NAND gate, the input of the third inverter coupled to the output of the second NAND gate; and a first and a second flip-flop register each having a clocking input, an signal input and an output for generating a detection flag signal, the clocking input of the first flip-flop register coupled to the output of the second inverter, the signal input of the first flip-flop register coupled to the detection signal, the clocking input of the second flip-flop register coupled to the output of the third inverter, the signal input of the second flip-flop register coupled to the detection signal.

6. The thermal sensing system according to claim 1, wherein the hysteresis circuit includes:

a first inverter having an input and an output, the input coupled to the output of the first flip-flop register to receive the detection flag signal of the first flip-flop register;

a first NOR gate having at least two inputs and one output, the first input coupled to the output of the second flip-flop register to receive the detection flag signal of the first flip-flop register;

a second NOR gate having at least two inputs and one output, the first input coupled to the output of the first inverter, the second input coupled to the output of the first NOR gate; and a third flip-flop register having a clocking input, an signal input and an output for generating a shutdown signal, the clocking input coupled to receive the temperature selection signal, the signal input coupled to receive the output of second NOR gate, the output coupled to the second input of the first NOR gate.

7. A thermal sensing system for an integrated circuit comprising:

a thermal sensing circuit coupled to receive at least two temperature selection signals of predetermined threshold temperatures and bias current for monitoring the temperature of the integrated circuit and generating at least one detection signal;

a decoder for decoding the temperature selection signals coupled to receive the temperature selection signals and generating decoded temperature selection signals; and a decode circuit coupled to said thermal sensing circuit for receiving the at least one detection signal, the decoded temperature selection signals, and a detection clocking signal, the decode circuit for generating corresponding detection flag signals at the predetermined threshold temperatures.

8. The thermal sense system according to claim 7, wherein the thermal sense circuit includes:

a current source;

a multiple output current mirror having an input lead and at least four output leads, the input lead coupled to the first current mirror;

a first and second MOS transistor having a gate, a source and a drain, the source of the first MOS transistor coupled to the first output of the multiple output current mirror for receiving current, the source of the second MOS transistor coupled to the second output of the multiple output current mirror for receiving current, gate of the first MOS transistor coupled to receive the first temperature selection signal, gate of the second MOS transistor coupled to receive the second temperature selection signal;

a bipolar transistor having a base, collector, and emitter, the base coupled to the third output of the multiple output current mirror and drain of the first and second MOS transistors, the collector coupled to the fourth output of the multiple output current mirror;

a resistor coupled between the base of the bipolar transistor and ground; and an inverting output driver for generating the detection signal, the inverting output driver coupled to the collector of the bipolar transistor.

9. The thermal sense circuit according to claim 8, wherein the multiple output current mirror having an input and at least four outputs includes a first MOS transistor having a source, drain and gate, the source coupled to the power supply rail, the drain and gate coupled to the input of the multiple output current mirror;

a second MOS transistor having a source, drain and gate, the source coupled to the power supply rail, the drain coupled to the first output of the multiple output current mirror, the gate coupled to the gate of the first MOS transistor;

a third MOS transistor having a source, drain and gate, the source coupled to the power supply rail, the drain coupled to the second output of the multiple output current mirror, the gate coupled to the gate of the first MOS transistor;

a fourth MOS transistor having a source, drain and gate, the source coupled to the power supply rail, the drain coupled to the third output of the multiple output current mirror, the gate coupled to the gate of the first MOS transistor; and a fifth MOS transistor having a source, drain and gate, the source coupled to the power supply rail, the drain coupled to the fourth output of the multiple output current mirror, the gate coupled to the gate of the first MOS transistor.

10. The thermal sense circuit according to claim 8, wherein the inverting output driver includes a first MOS transistor having a source, drain and gate, the source coupled to the power supply rail and a second MOS transistor having a source, drain and gate, the source coupled to ground, the gate coupled to the gate of the first MOS transistor, the drain coupled to the drain of the first MOS transistor to form a detection signal node.

11. The thermal sensing system according to claim 8, wherein the decode circuit includes:

a first, second, third and fourth NAND gate, each NAND gate having at least two inputs and at least one output, each NAND gate having the first input coupled to the detection clock signal, the second input of the first NAND gate coupled to the first decoded temperature selection signal, the second input of the second NAND gate coupled to the second decoded temperature selection signal, the second input of the third NAND gate coupled to the third decoded temperature selection signal, the second input of the fourth NAND gate coupled to the fourth decoded temperature selection signal, the first input of the second NAND gate coupled to the first input of the first NAND gate;

a first, second, third and fourth inverter having an input and an output, the input of the first inverter coupled to the output of the first NAND gate, the input of the second inverter coupled to the output of the second NAND gate, the input of the third inverter coupled to the output of the third NAND gate, the input of the fourth inverter coupled to the output of the fourth NAND gate; and a first, second, third and fourth flip-flop register each having a clocking input, an signal input and an output for generating a detection flag signal, each flip-flop register having the signal input coupled to the detection signal node, the clocking input of the first flip-flop register coupled to the output of the first inverter, the clocking input of the second flip-flop register coupled to the output of the second inverter, the clocking input of the third flip-flop register coupled to the output of the third inverter, the clocking input of the fourth flip-flop register coupled to the output of the fourth inverter.

* * * * *

UNITED STATES PATENT AND TRADEMARK OFFICE
CERTIFICATE OF CORRECTION

PATENT NO. : 6,717,530 B1  
APPLICATION NO. : 09/638839  
DATED : April 6, 2004  
INVENTOR(S) : Thomas A. Schmidt et al.

Page 1 of 1

It is certified that error appears in the above-identified patent and that said Letters Patent is hereby corrected as shown below:

Title page Item 30, Insert
--Claim priority from provisional application number 60/151,601 filed August 30, 1999.--

Signed and Sealed this

Twenty-fourth Day of February, 2009

JOHN DOLL  
*Acting Director of the United States Patent and Trademark Office*